(12) United States Patent
Nakae (10) Patent No.: US 11,109,510 B2
(45) Date of Patent: Aug. 31, 2021

(54) COOLING APPARATUS (71) Applicant: Nidec Corporation, Kyoto (JP)

(72) Inventor: Nobuya Nakae, Kyoto (JP)

(73) Assignee: NIDEC CORPORATION, Kyoto (JP)

(*) Notice: Subject to any disclaimer, the term of this patent is extended or adjusted under 35 U.S.C. 154(b) by 0 days.

(21) Appl. No.: 16/689,181

(22) Filed: Nov. 20, 2019

(65) Prior Publication Data

US 2020/0214170 A1 Jul. 2, 2020

(30) Foreign Application Priority Data

Dec. 28, 2018 (JP) .............................. JP2018-248650

(51) Int. Cl.
*H05K 7/20* (2006.01)
*F28F 1/32* (2006.01)

(52) U.S. Cl.
CPC ......... *H05K 7/20254* (2013.01); *F28F 1/325* (2013.01); *H05K 7/20272* (2013.01)

(58) Field of Classification Search
CPC ... F28F 1/325; H01L 23/473; H05K 7/20254; H05K 7/20272; H05K 7/20336; H05K 7/20509; H05K 7/20663; H05K 7/20672; H05K 2201/064
See application file for complete search history.

(56) References Cited

U.S. PATENT DOCUMENTS

| | | | |
|---|---|---|---|
| 2004/0008487 A1* | 1/2004 | Hisano | H05K 7/20254 361/690 |
| 2004/0190250 A1 | 9/2004 | Iijima et al. | |
| 2005/0069432 A1* | 3/2005 | Tomioka | G06F 1/203 417/423.1 |
| 2007/0034353 A1* | 2/2007 | Liu | H01L 23/473 165/80.4 |
| 2013/0105119 A1* | 5/2013 | Hwang | F28D 15/00 165/104.19 |
| 2017/0027081 A1* | 1/2017 | Zhang | H05K 7/20254 |
| 2017/0034950 A1* | 2/2017 | Sung | G06F 1/20 |
| 2017/0257979 A1* | 9/2017 | Wu | H05K 7/20263 |
| 2018/0063993 A1* | 3/2018 | Wu | H05K 7/20272 |
| 2018/0139864 A1* | 5/2018 | Hayashi | F25D 17/00 |
| 2018/0199466 A1* | 7/2018 | Thiessen | H05K 7/20254 |
| 2019/0056179 A1* | 2/2019 | Chialastri | F28D 15/0208 |
| 2019/0208665 A1* | 7/2019 | Tsai | H05K 7/20409 |

* cited by examiner

Primary Examiner — Jacob R Crum
(74) Attorney, Agent, or Firm — Keating & Bennett, LLP (57) ABSTRACT

A cooling apparatus includes a cold plate including a first refrigerant channel through which refrigerant flows, a radiator including fins and pipes defining second refrigerant channels communicating with the first refrigerant channel, a pump to circulate the refrigerant, a first tank coupled to one end of each of the pipes, and a second tank coupling another end of each of the pipes and the pump. The radiator is located on the cold plate. The pump is adjacent to a side of the cold plate.

17 Claims, 7 Drawing Sheets

COOLING APPARATUS

CROSS REFERENCE TO RELATED APPLICATION

The present application claims priority under 35 U.S.C. § 119 to Japanese Application No. 2018-248650 filed on Dec. 28, 2018, the entire contents of which are hereby incorporated herein by reference.

FIELD OF THE INVENTION

The present disclosure relates to a cooling apparatus.

BACKGROUND

A known electronic-component cooling apparatus includes a heatsink, a radiator, and an electric pump.

For example, the heatsink of a known electronic-component cooling apparatus has an electronic-component mount surface to which an electronic component to be cooled is mounted and a refrigerant channel through which liquid refrigerant flows. The radiator has a liquid channel through which the refrigerant flows. The liquid channel is air-cooled to cool the refrigerant. The electric pump provides migration energy to the refrigerant to circulate the refrigerant between the heatsink and the radiator.

However, the heatsink, the radiator, and the electric pump of the known cooling apparatus are connected to each other with pipes, which results in an increase in the size of the entire cooling apparatus.

SUMMARY

An exemplary cooling apparatus of the present disclosure includes a cold plate, a radiator, a pump, a first tank, and a second tank. The cold plate includes a first refrigerant channel through which refrigerant flows. The radiator includes a plurality of fins, and a plurality of pipes defining a second refrigerant channel communicating with the first refrigerant channel. The pump is configured to circulate the refrigerant. The first tank is coupled to one end of each of the plurality of the pipes. The second tank couples another end of each of the plurality of the pipes and the pump. The radiator is located on the cold plate. The pump is adjacent to a side of the cold plate.

The above and other elements, features, steps, characteristics and advantages of the present disclosure will become more apparent from the following detailed description of the example embodiments with reference to the attached drawings.

DETAILED DESCRIPTION

Example embodiments of the present disclosure are described hereinbelow with reference to the drawings. In the application concerned, the side, where a radiator 20 is disposed, of a cold plate 10 is referred to as an "upside", and the side opposite from the side where the radiator 20 is disposed is referred to as a "downside". In the application, a direction in which the radiator 20 is disposed on the cold plate 10 is referred to as an "up-down direction", and a direction perpendicular to the "up-down direction" is referred to as a "horizontal direction" to describe the shapes of the components and the positional relationships thereof. However, these definitions of the up-down direction and the horizontal direction are merely for the convenience of description and are not intended to limit the directions in manufacturing and using the cooling apparatus 1 according to the present disclosure. In the application, a longitudinal direction of the cold plate 10 in top view is referred to as a "longitudinal direction X", and a lateral direction thereof is referred to as a "lateral direction Y". A direction perpendicular to an upper surface of the cold plate 10 is referred to as a "perpendicular direction Z".

In the application, a "parallel direction" includes a substantially parallel direction. In the application, a "perpendicular direction" includes a substantially perpendicular direction.

Figure 1:
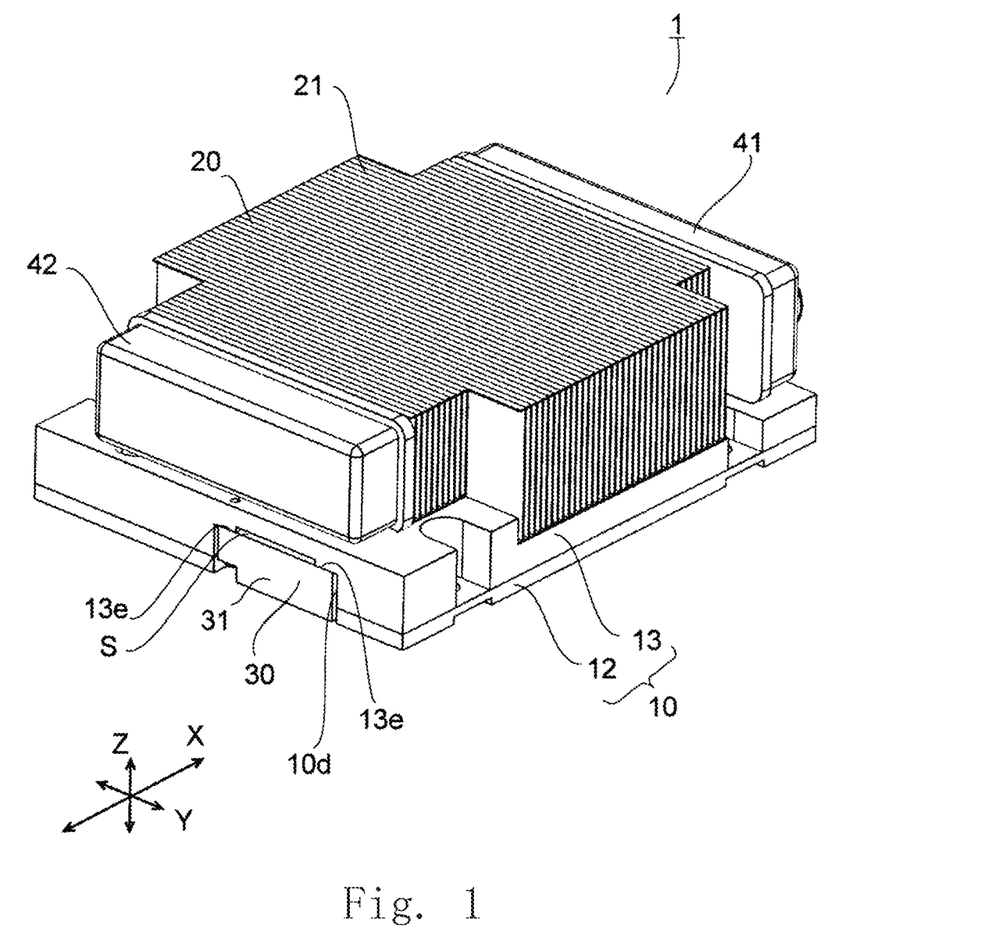
FIG. 1 is a top perspective view of a cooling apparatus according to an example embodiment of the present disclosure.
Figure 2:
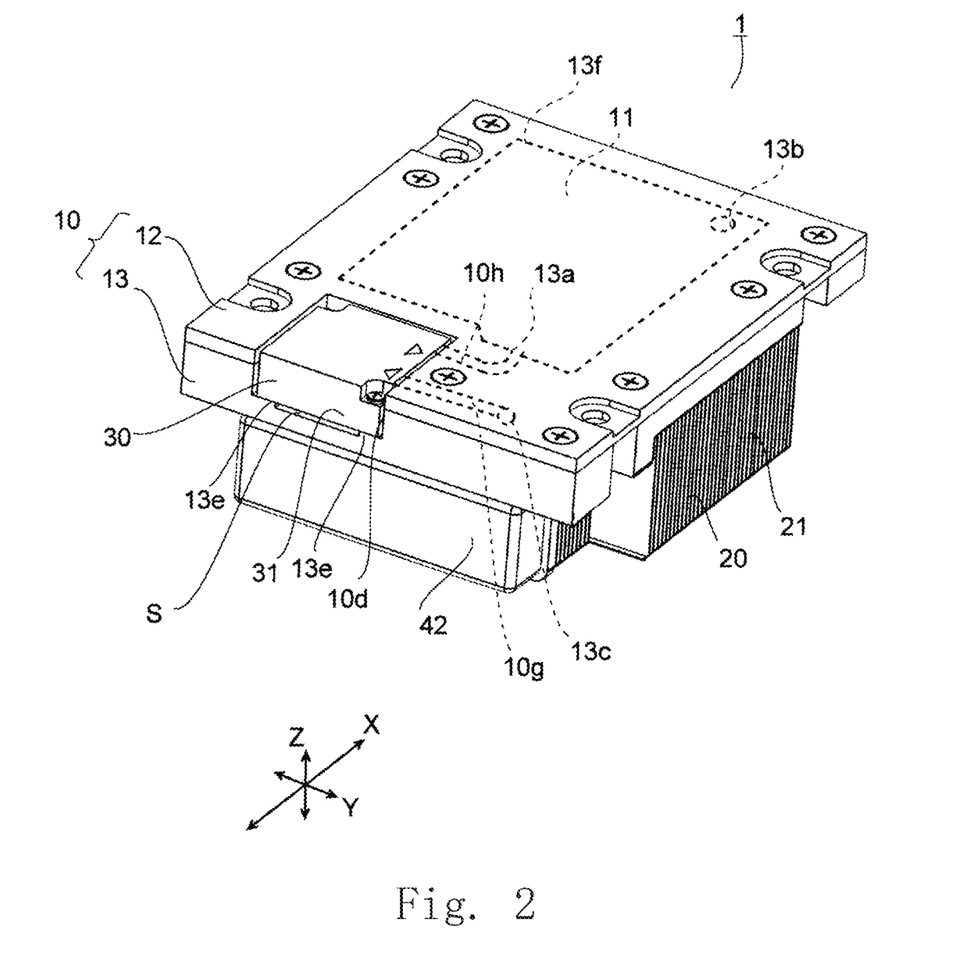
FIG. 2 is a bottom perspective view of a cooling apparatus according to an example embodiment of the present disclosure.
Figure 3:
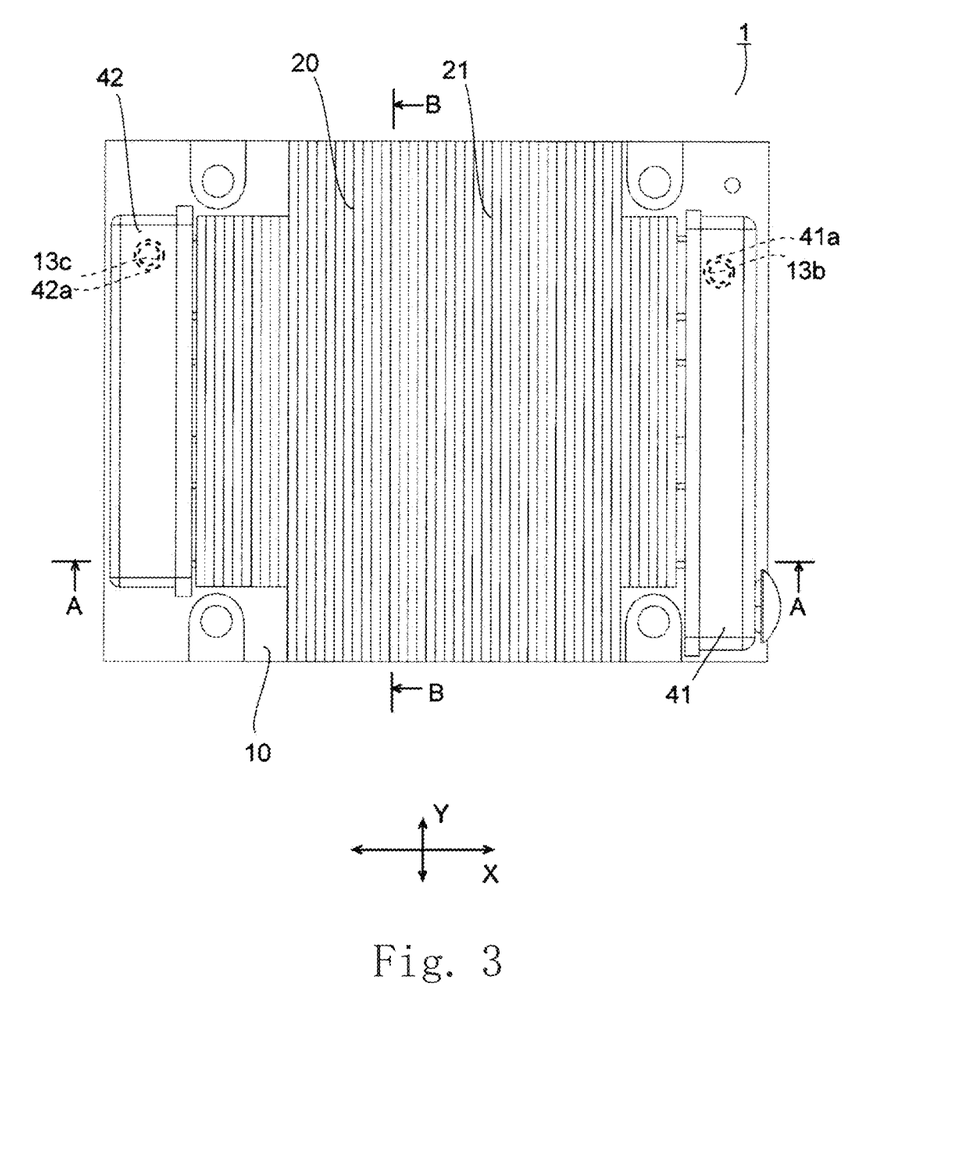
FIG. 3 is a top view of the cooling apparatus according to an example embodiment of the present disclosure.
Figure 4:
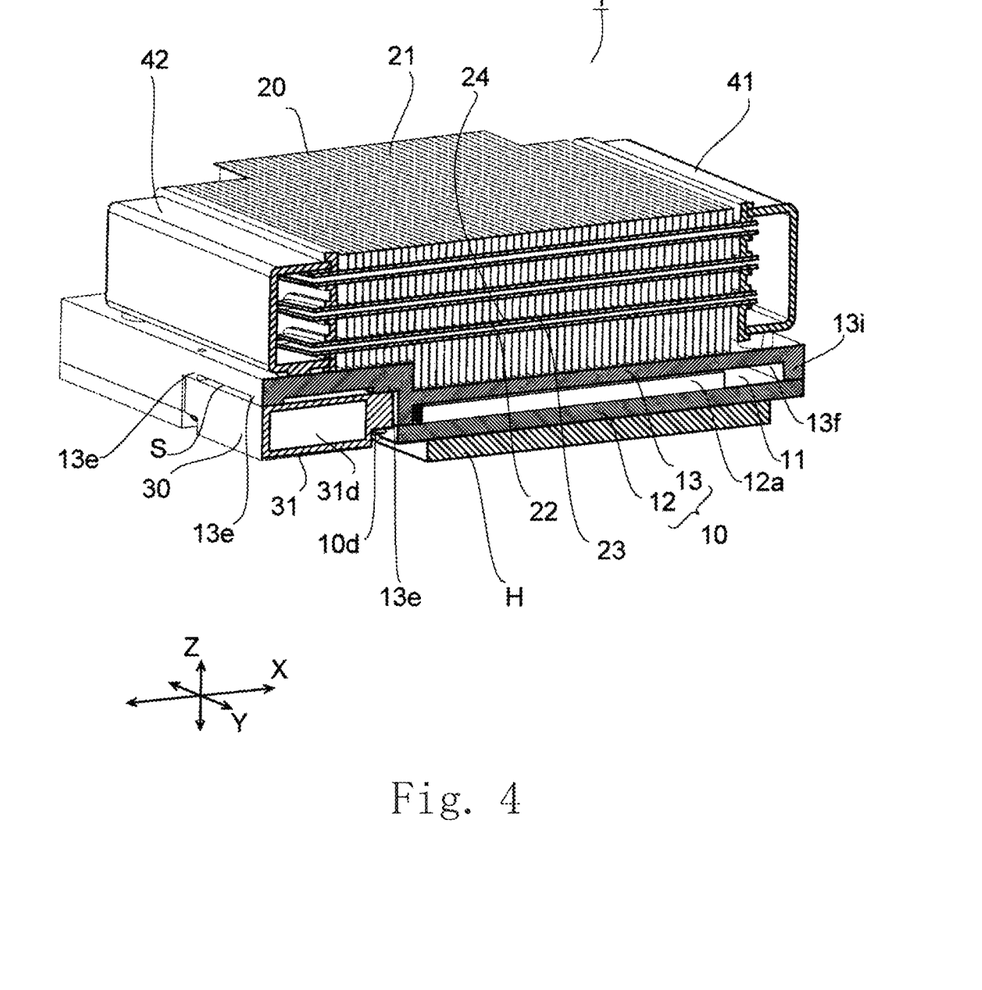
FIG. 4 is a sectional perspective view taken along line A-A in FIG. 3.
Figure 5:
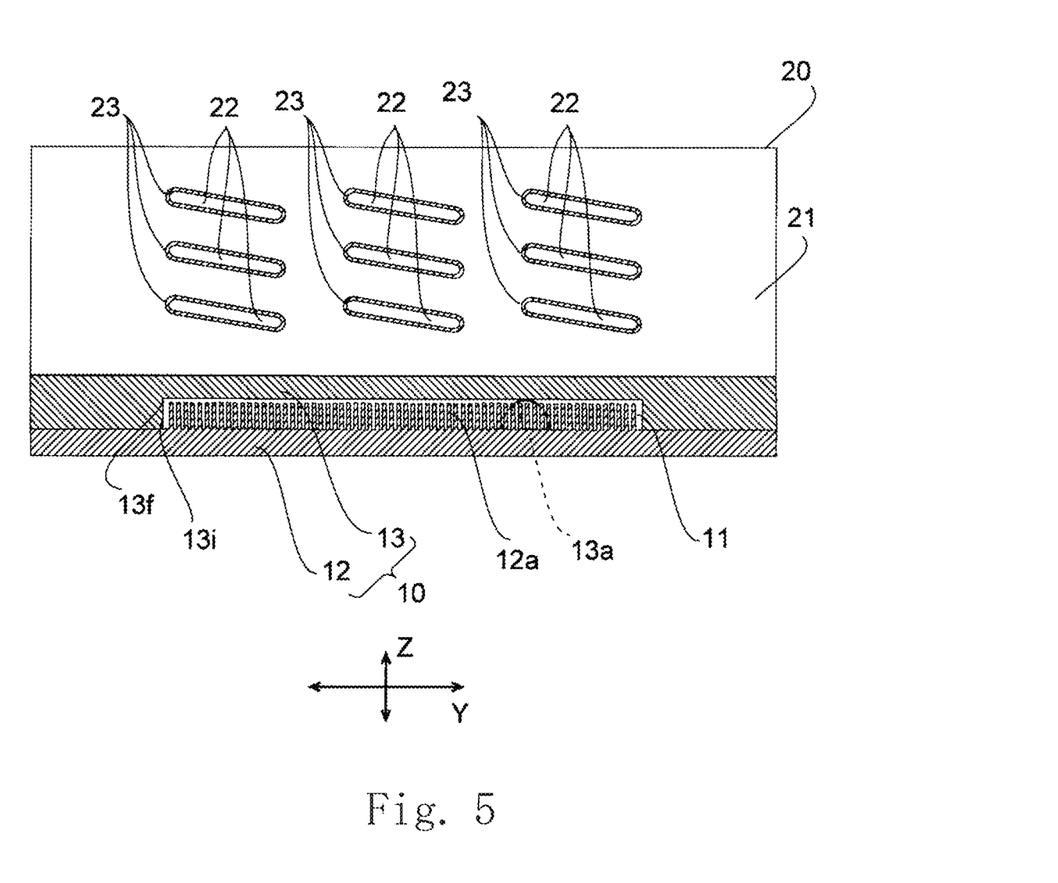
FIG. 5 is a sectional view taken along line B-B in FIG. 3.

A cooling apparatus according to an example embodiment of the present disclosure is described. FIGS. 1 and 2 are respectively a top perspective view and a bottom perspective view of a cooling apparatus 1 according to an example embodiment of the present disclosure. FIG. 3 is a top view of the cooling apparatus 1, and FIG. 4 is a sectional perspective view taken along line A-A in FIG. 3. FIG. 5 is a sectional view taken along line B-B in FIG. 3.

In FIG. 2, a first refrigerant channel 11, a recessed portion 13f, an inlet 13a, an outlet 13b, an ejection tube 10h, and a suction tube 10g, which cannot be viewed from the outside of the cooling apparatus 1, are indicated by broken lines. In FIG. 3, the outlet 13b, an upper wall through-hole 13c, a first tank through-hole 41a, and a second tank through-hole 42a, which cannot be viewed from the outside of the cooling apparatus 1, are indicated by broken lines.

The cooling apparatus 1 includes the cold plate 10, the radiator 20, a first tank 41, a second tank 42, and a pump 30. The radiator 20, the first tank 41, and the second tank 42 are disposed on the cold plate 10. The lower surfaces of the radiator 20, the first tank 41, and the second tank 42 are in contact with the upper surface of the cold plate 10. The pump 30 is disposed adjacently to a side of the cold plate 10. Accordingly, the cold plate 10, the radiator 20, the pump 30, the first tank 41, and the second tank 42 are formed into a single unit to reduce the size of the entire cooling apparatus 1, thereby improving the performance of handling the entire cooling apparatus 1.

The cold plate 10, the radiator 20, and the pump 30 are directly connected, which reduces the number of joint members, such as pipes. This further reduces the size of the cooling apparatus 1. Thus, it is easy to mount the cooling apparatus 1 to a machine. The cold plate 10, the radiator 20, and the pump 30 may be coupled in an area on the cold plate 10 using shortened pipes or the like.

The cold plate 10 is composed of metal with high thermal conductivity, such as copper or aluminum, and has a bottom wall 12 and an upper wall 13. In this example embodiment, the cold plate 10 is rectangular in top view. In other words, the bottom wall 12 and the upper wall 13 are in the form of plates extending in the horizontal direction in top view. Although the bottom wall 12 and the upper wall 13 of this example embodiment are rectangular in top view, this is given for mere illustrative purposes. For example, the bottom wall 12 and the upper wall 13 may be polygonal or circular in top view. The lower surface of the bottom wall 12 is in contact with a heating component H (see FIG. 4).

A notch 10d is formed by bending a short side of the cold plate 10. The side and the downside of the notch 10d are open, and the upside of the notch 10d is closed. In other words, the upside of the notch 10d is covered with the upper wall 13.

The notch 10d houses the pump 30, and the lower surface of the upper wall 13 and the upper surface of the pump 30 face each other. Accordingly, the size of the entire cooling apparatus 1 is reduced in the up-down direction. The outer side of the pump 30 is located inside the open end of the side of the notch 10d. This further reduces the size of the entire cooling apparatus 1. Thus, the outer side of the pump 30 is prevented from coming into contact with a member disposed around the heating component H when the heating component H is brought into contact with the lower surface of the cold plate 10. Although in this example embodiment the outer side of the pump 30 is positioned inside the open end of the side of the notch 10d, it is sufficient that at least part of the pump 30 is disposed in the notch 10d to reduce the size of the entire cooling apparatus 1.

The lower end of the pump 30 is disposed above the lower surface of the cold plate 10. This prevents the lower end of the pump 30 from coming into contact with a mounting surface of the heating component H, when the heating component H is brought into contact with the cold plate 10, and prevents a clearance formed between the cold plate 10 and the heating component H. Thus, the heat generated from the heating component H is efficiently transferred to the bottom wall 12 of the cold plate 10.

The cold plate 10 has the first refrigerant channel 11, the suction tube 10g, and the ejection tube 10h through which the refrigerant flows.

The first refrigerant channel 11 is formed in an inner space enclosed by the bottom wall 12, the upper wall 13, and a side wall 13i. The side wall 13i is provided outside the recessed portion 13f formed upward from the lower surface of the upper wall 13. The recessed portion 13f is formed by, for example, cutting the upper wall 13. The upper wall 13 and the side wall 13i may be formed of different members.

The first refrigerant channel 11 houses a plurality of parallel blades 12a. The upper wall 13 has an outlet 13b passing through the upper wall 13 in the up-down direction and an upper wall through-hole 13c passing there the upper wall 13 in the up-down direction (see FIG. 3). The side wall 13i has an inlet 13a that opens to the first refrigerant channel 11 (see FIG. 5). The refrigerant flowing into the first refrigerant channel 11 through the inlet 13a flows out of the first refrigerant channel 11 through the outlet 13b. In this example embodiment, the refrigerant is liquid, for example, an anti-freeze solution (such as an ethylene glycol aqueous solution or a propylene glycol aqueous solution), pure water, or others.

One end of the suction tube 10g opens to the notch 10d on the side of the cold plate 10. The other end of the suction tube 10g extends linearly in the lateral direction Y to communicate with the upper wall through-hole 13c (see FIG. 2).

One end of ejection tube 10h opens to the notch 10d on the side of the cold plate 10. The ejection tube 10h extends in the lateral direction Y and bends at the other end in the longitudinal direction X to communicate with the inlet 13a (see FIG. 2). The suction tube 10g and the ejection tube 10h are respectively coupled to a suction port 31a and an ejection port 31b of the pump 30 (described later). The suction tube 10g and the ejection tube 10h are described in detail below.

The pump 30 is a cascade pump and includes a refrigerant channel 31d in a rectangular casing 31 (see FIG. 4). The channel 31d houses an impeller (not illustrated) supported so as to be rotatable about the central axis extending in the up-down direction. The impeller is coupled to the rotation shaft of a motor (not illustrated).

The pump 30 has the suction port 31a for sucking the refrigerant and the ejection port 31b for ejecting the refrigerant to the outside. Specifically, the casing 31 has the suction port 31a and the ejection port 31b on the same side (see FIGS. 2 and 6). The suction port 31a and the ejection port 31b protrude outward from the side of the casing 31. The suction port 31a is coupled to the suction tube 10g, and the ejection port 31b is coupled to the ejection tube 10h. The impeller is rotated by driving the motor, so that the refrigerant flowing into the casing 31 through the suction port 31a is ejected through the ejection port 31b. In this example embodiment, the suction port 31a and the ejection port 31b extend in a direction perpendicular to pipes 23.

The refrigerant ejected from the ejection port 31b passes through the ejection tube 10h into the first refrigerant channel 11 via the inlet 13a. The first refrigerant channel 11 is coupled to the ejection port 31b, and the second refrigerant channel 22 is coupled to the suction port 31a via the second tank 42. Thus, the refrigerant cooled through the second refrigerant channel 22 flows into the pump 30. This prevents the heat from being transferred to an electronic component (not illustrated) mounted in the pump 30, thereby improving the reliability of the pump 30.

The radiator 20 includes a plurality of fins 21 and a plurality of pipes 23. The fins 21 have a planar shape, rising upright from the upper surface of the upper wall 13 and extending in the horizontal direction of the cold plate 10. In this example embodiment, the plurality of fins 21 extend in the lateral direction Y of the cold plate 10. The fins 21 are arrayed at regular intervals in the longitudinal direction X of the cold plate 10.

The lower ends of the fins 21 are in contact with the upper surface of the upper wall 13. This increases the thermal conductivity from the upper wall 13 to the fins 21. The fins 21 and the upper wall 13 may be separate members or the same member. In this example embodiment, the fins 21 are members separate from the upper wall 13. The lower ends of the fins 21 are joined to the upper surface of the upper wall 13, for example, by welding.

If the fins 21 are the same members as the upper wall 13, the fins 21 are formed, for example, by cutting the upper surface of the upper wall 13.

If the fins 21 and the upper wall 13 are separate members, the fins 21 are preferably made of metal with high thermal conductivity, such as copper or aluminum, as the cold plate 10 is. When the fins 21 are made of metal with high thermal conductivity, like the cold plate 10, the heat from the cold plate 10 can be efficiently transferred to the fins 21.

The pipes 23 each form a second refrigerant channel 22, which is hollow and through which the refrigerant passes. The second refrigerant channels 22 communicate with the first refrigerant channel 11. Specifically, one end of each second refrigerant channel 22 communicates with one end of the first refrigerant channel 11 via the first tank 41. The other end of the second refrigerant channel 22 communicates with the other end of the first refrigerant channel 11 via the second tank 42 and the pump 30.

The pipes 23 extend linearly in the longitudinal direction X of the cold plate 10. The pipes 23 have a flat cross section and are inclined in the Y-Z plane with respect to the upper surface of the cold plate 10 (see FIG. 5). The pipes 23 are each placed in a fin through-hole 24 provided in the plurality of fins 21 and are fixed to the plurality of fins 21 by welding. A direction in which the pipes 23 extend and a direction in which the fins 21 extend cross at right angles. In other words, in this example embodiment, the plurality of fins 21 extend in the lateral direction Y, and the pipes 23 extend in the longitudinal direction X. Directions in which the fins 21 and the pipes 23 extend are not limited to the directions described above. For example, the pipes 23 may be disposed at an angle with respect to the direction in which the fins 21 extend.

One end of each pipe 23 is coupled to the first tank 41, and the other end of each pipe 23 is coupled to the second tank 42. The first tank 41 and the second tank 42 are opposed in the direction in which the pipes 23 extend. Accordingly, the refrigerant smoothly flows linearly from the first tank 41 to the second tank 42 through the pipes 23.

The first tank 41 and the second tank 42 are disposed parallel to the array of the fins 21. This allows more fins 21 to be disposed between the first tank 41 and the second tank 42 at predetermined intervals. As a result, the surface area of the entire fins 21 increases, thereby improving the cooling performance of the radiator 20. Furthermore, it is easy to connect the pipes 23, the first tank 41, and the second tank 42.

The pipes 23 pass through the sides of the first tank 41 and the second tank 42 and are directly coupled to the first tank 41 and the second tank 42 (see FIG. 4). This reduces the number of components of the cooling apparatus 1 and increases the lengths of the pipes 23 in the longitudinal direction X to more efficiently cool the refrigerant.

As illustrated in FIG. 5, the pipes 23 in this example embodiment are disposed in three arrays in the horizontal direction and in three arrays in the up-down direction. Thus, nine pipes 23 in total are connected in parallel via the first tank 41 and the second tank 42 (see FIG. 5). Accordingly, heat is transferred from the pipes 23 to the plurality of fins 21, thereby efficiently cooling the refrigerant, while suppressing an increase in the size of the cooling apparatus 1. The number of the pipes is not limited to nine and may be eight or less, or ten or more. The plurality of pipes 23 may not be disposed at regular intervals and may be disposed at different positions in the up-down direction.

The first tank 41 and the second tank 42 are rectangular cuboids and respectively have a first tank through-hole 41a and a second tank through-hole 42a in the lower surfaces passing through the first tank 41 and the second tank 42 in the up-down direction.

The second tank 42 is disposed above the notch 10d. This allows the pump 30 in the notch 10d and the second tank 42 to be disposed close to each other. Accordingly, the number of components, such as a pipe coupling the pump 30 and the second tank 42 is reduced, thereby reducing the size of the cooling apparatus 1.

Disposing the second tank through-hole 42a in the lower surface of the second tank 42 further reduces the number of components, such as a pipe coupling the pump 30 and the second tank 42. The first tank through-hole 41a is aligned and communicates with the outlet 13b of the upper wall 13 in the up-down direction (see FIG. 3). The second tank through-hole 42a is aligned and communicates with an end of the upper wall through-hole 13c communicating with the suction tube 10g in the up-down direction (see FIG. 3).

Figure 6:
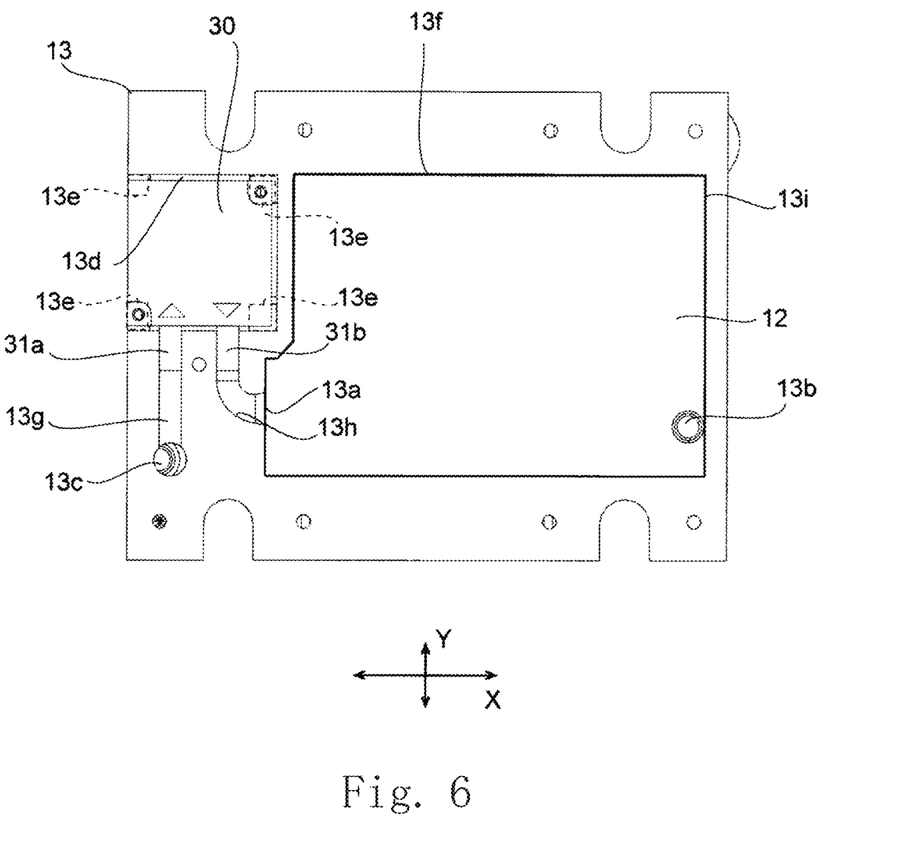
FIG. 6 is a bottom view of an upper wall of the cold plate of a cooling apparatus according to an example embodiment of the present disclosure.
Figure 7:
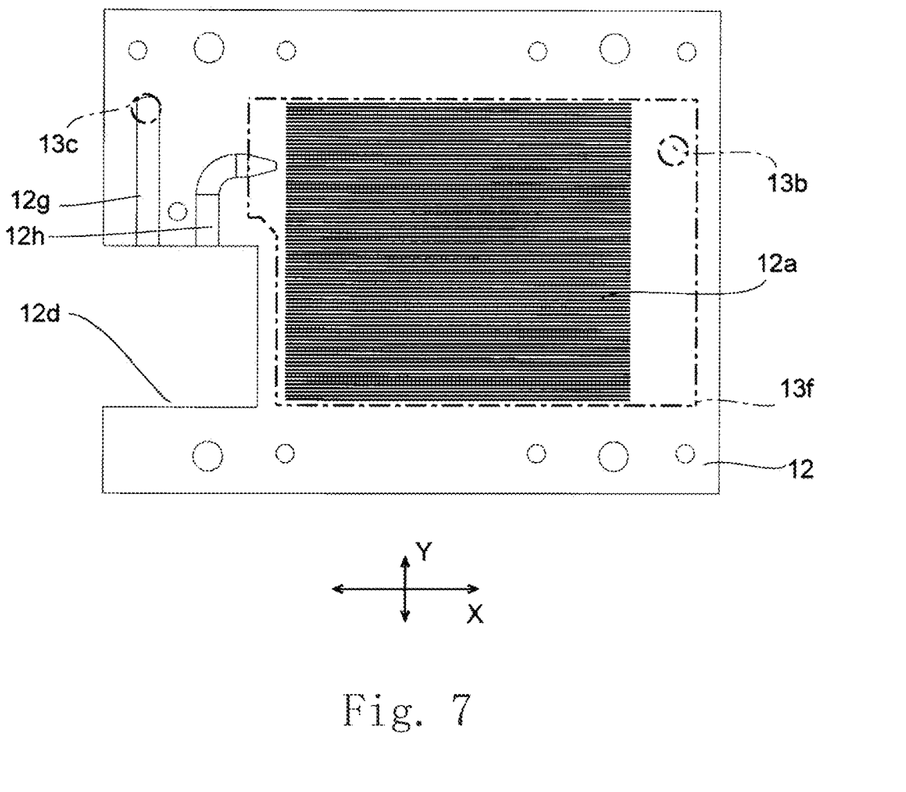
FIG. 7 is a top view of a bottom wall of the cold plate of the cooling apparatus according to an example embodiment of the present disclosure.

FIG. 6 is a bottom view of the upper wall 13 and illustrates a state in which the pump 30 is disposed. FIG. 7 is a top view of the bottom wall 12. In FIG. 7, the one-dot chain line indicates the outlet 13b and the recessed portion 13f of the upper wall 13.

Sides on the short side of the upper wall 13 and the bottom wall 12 are bent in top view to form an upper-wall notch 13d and a bottom-wall notch 12d, respectively. The side and the lower side of the upper-wall notch 13d are open, and the upper side of the notch 10d is closed. The upper-wall notch 13d and the bottom-wall notch 12d form the notch 10d of the cold plate 10.

Protrusions 13e protruding downward are provided at the four corners of the lower surface of the upper-wall notch 13d. The upper surface of the pump 30 is in contact with the lower surfaces of the protrusions 13e. As a result, an interspace S is formed between the lower surface of the upper wall 13 and the upper surface of the pump 30 (see FIG. 1). In other words, there is the interspace S between the lower surface of the upper wall 13 and the upper surface of the pump 30. This reduces transfer of the heat of the cold plate 10 to the pump 30 and prevents acceleration of heat generation of an electronic component (not illustrated) in the pump 20, thereby increasing the service life of the pump 20.

The lower surface of the upper wall 13 has a groove 13g recessed upward and a groove 13h recessed upward. The upper surface of the bottom wall 12 has a groove 12g recessed downward and a groove 12h recessed downward. When the lower surface of the upper wall 13 and the upper surface of the bottom wall 12 are joined in the up-down direction, the groove 13g and the groove 12g face in the up-down direction to form the suction tube 10g, and the groove 13h and the groove 12h face in the up-down direction to form the ejection tube 10h.

In other words, the cold plate 10 includes the suction tube 10g and the ejection tube 10h. The suction tube 10g is formed of the groove 13g and the groove 12g facing in the up-down direction. The ejection tube 10h is formed of the groove 13h and the groove 12h facing in the up-down direction.

The suction port 31a is held by the groove 13g and the groove 12g and is coupled to the suction tube 10g. The ejection port 31b is held by the groove 13h and the groove 12h and is coupled to the ejection tube 10h.

Specifically, the inner surfaces of the groove 13g and the groove 12g and the outer surface of the suction port 31a are brought into contact with each other, and the outer surface of the suction port 31a is pressed by the inner surfaces of the groove 13g and the groove 12g from above and below. Likewise, the inner surfaces of the groove 13h and the groove 12h and the outer surface of the ejection port 31b are brought into contact with each other, and the outer surface of the ejection port 31b is pressed by the inner surfaces of the groove 13h and the groove 12h from above and below. This makes it easy to couple the suction port 31a and the ejection port 31b to the suction tube 10g and the ejection tube 10h, respectively.

More specifically, the pump 30 is placed on the protrusions 13e of the upper-wall notch 13d, and the suction port 31a and the ejection port 31b are respectively fit in the groove 13g and the groove 13h, thereafter, the lower surface of the upper wall 13 and the upper surface of the bottom wall 12 are joined together in the up-down direction while the grooves 12g and 12h are being pressed against the suction port 31a and the ejection port 31b, respectively. Thus, the suction port 31a and the ejection port 31b are accurately positioned and easily coupled to the suction tube 10g and the ejection tube 10h, respectively.

The blades 12a are provided on the upper surface of the bottom wall 12. The blades 12a extend in the longitudinal direction X of the cold plate 10 and disposed parallel to each other at regular intervals in the lateral direction Y. A clearance is formed in the up-down direction between the upper ends of the blades 12a and the lower surface of the upper wall 13 (see FIG. 5). The upper ends of the blades 12a may be in contact with the lower surface of the upper wall 13.

The refrigerant flowing into the first refrigerant channel 11 through the inlet 13a spreads in the lateral direction Y on the bottom wall 12 to flow between the plurality of blades 12a. The refrigerant flowing between the plurality of blades 12a spreads over the first refrigerant channel 11 and flows out through the outlet 13b. Accordingly, the entire lower surface of the cold plate 10 is cooled by the refrigerant.

The lower surface of the bottom wall 12 is in contact with the heating component H (see FIG. 4). The heating component H is preferably disposed on the lower surface of the bottom wall 12 facing the first refrigerant channel 11 in the up-down direction. Opposing the heating component H and the first refrigerant channel 11 in the up-down direction allows the heat generated from the heating component H to be efficiently transferred to the refrigerant flowing in the first refrigerant channel 11.

It is more preferable that the heating component H be disposed below the area of the blades 12a. In other words, the heating component H is located within the width of the blades 12a in the longitudinal direction X in which the blades 12a extend and within the width of the array of the blades 12a in the lateral direction Y in which the blades 12a are arrayed. Disposing the heating component H at a position overlapping the area allows the heating component H to be cooled more efficiently.

More preferably, the heating component H is disposed at a position overlapping a line connecting the inlet 13a and the outlet 13b. The refrigerant circulating in the cooling apparatus 1 is cooled by the radiator 20 around the line connecting the inlet 13a and the outlet 13b. Accordingly, disposing the heating component H on this line allows the heating component H to be cooled more efficiently.

The heating component H to be cooled, such as a central processing unit (CPU), is brought into contact with the lower surface of the bottom wall 12 of the cold plate 10, and the pump 30 is driven. This causes the refrigerant to circulate through the first refrigerant channel 11, the first tank 41, the second refrigerant channel 22, and the second tank 42 in this order. The heat of the heating component H is transferred to the bottom wall 12 of the cold plate 10. The heat transferred to the bottom wall 12 is transferred to the fins 21 through the upper wall 13 and via the refrigerant flowing through the first refrigerant channel 11 and the second refrigerant channel 22. Thus, heat is radiated through the fins 21, thereby preventing an increase in the temperature of the heating component H.

Disposing a cooling fan (not illustrated) on a side of the radiator 20 and sending cooling air in the direction in which the fins 21 extend (the lateral direction Y) promote heat radiation from the fins 21, thereby further improving the cooling performance of the radiator 20.

The above example embodiments are given for mere illustrative purposes. The configurations of the example embodiments may be changed as appropriate without departing from the technical spirit of the present disclosure. The example embodiments may be combined within the possible scope.

Although the above example embodiments use the cascade pump 30, a diaphragm pump or a centrifugal pump may be used.

The motor of the present disclosure may be used in a cooling apparatus that cools an electronic component, such as a microcomputer.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cooling apparatus comprising:
   a cold plate including a first refrigerant channel through which refrigerant flows, the cold plate extending in a first direction and a second direction perpendicular to the first direction;
   a radiator including a plurality of fins, and a plurality of pipes defining a second refrigerant channel communicating with the first refrigerant channel;
   a pump to circulate the refrigerant;
   a first tank coupled to one end of each of the plurality of the pipes; and
   a second tank coupling another end of each of the plurality of the pipes and the pump; wherein
   the radiator is located on the cold plate in a third direction that is perpendicular to both the first direction and the second direction;
   the cold plate includes a bottom wall and an upper wall;
   a lower surface of the bottom wall is in contact with a heating element;
   the upper wall is located in contact with the bottom wall in the third direction;
   the cold plate includes a notch defined by a bend in a side of the cold plate in the first direction;
   at least a portion of the pump is located in the notch;
   the upper wall covers an upper side of the pump in the third direction; and
   a lower surface of the upper wall and an upper surface of the pump directly oppose each other in the third direction, and a lower portion of the radiator and an upper surface of the upper wall directly oppose each other in the third direction.

2. The cooling apparatus according to claim 1, wherein a space is present between the lower surface of the upper wall and the upper surface of the pump.

3. The cooling apparatus according to claim 1, wherein an outer side of the pump is located inside an open end on a side of the notch.

4. The cooling apparatus according to claim 1, wherein
   the pump includes an ejection port to eject the refrigerant outward and a suction port to suck the refrigerant inward;
   the first refrigerant channel is coupled to the ejection port; and
   the second refrigerant channel is coupled to the suction port via the second tank.

5. The cooling apparatus according to claim 4, wherein the second tank is located above the notch.

6. The cooling apparatus according to claim 5, wherein a lower surface of the second tank includes a second tank through-hole communicating with the suction port.

7. The cooling apparatus according to claim 1, wherein
the plurality of pipes extend linearly; and
the first tank and the second tank are opposed in a direction in which the plurality of pipes extend.

8. The cooling apparatus according to claim 1, wherein a lower end of the pump is above a lower surface of the cold plate.

9. The cooling apparatus according to claim 1, wherein the pump is a cascade pump.

10. A cooling apparatus comprising:
a cold plate including a first refrigerant channel through which refrigerant flows, the cold plate extending in a first direction and a second direction perpendicular to the first direction;
a radiator including a plurality of fins, and a plurality of pipes defining a second refrigerant channel communicating with the first refrigerant channel;
a pump to circulate the refrigerant;
a first tank coupled to one end of each of the plurality of the pipes; and
a second tank coupling another end of each of the plurality of the pipes and the pump; wherein
the radiator is located on the cold plate in a third direction that is perpendicular to both the first direction and the second direction;
the cold plate includes a bottom wall and an upper wall;
a lower surface of the bottom wall is in contact with a heating element;
the upper wall is located in contact with the bottom wall in the third direction;
the cold plate includes a notch defined by a bend in a side of the cold plate in the first direction;
at least a portion of the pump is located in the notch;
the upper wall covers an upper side of the pump in the third direction;
a lower surface of the upper wall and an upper surface of the pump directly oppose each other in the third direction; and
a lower surface of the pump is exposed to an outside in the first direction and the third direction and uncovered by any portion of the cold plate.

11. The cooling apparatus according to claim 10, wherein a space is present between the lower surface of the upper wall and the upper surface of the pump.

12. The cooling apparatus according to claim 10, wherein an outer side of the pump is located inside an open end on a side of the notch.

13. The cooling apparatus according to claim 10, wherein
the pump includes an ejection port to eject the refrigerant outward and a suction port to suck the refrigerant inward;
the first refrigerant channel is coupled to the ejection port; and
the second refrigerant channel is coupled to the suction port via the second tank.

14. The cooling apparatus according to claim 13, wherein the second tank is located above the notch.

15. The cooling apparatus according to claim 14, wherein a lower surface of the second tank includes a second tank through-hole communicating with the suction port.

16. The cooling apparatus according to claim 10, wherein
the plurality of pipes extend linearly; and
the first tank and the second tank are opposed in a direction in which the plurality of pipes extend.

17. The cooling apparatus according to claim 10, wherein the lower surface of the pump is above a lower surface of the cold plate.

* * * * *